(12) United States Patent
Carruthers et al.

(10) Patent No.: US 6,678,132 B1
(45) Date of Patent: Jan. 13, 2004

(54) GROUND FAULT DETECTION SYSTEM

(75) Inventors: Peter Alexander Carruthers, Ithaca, NY (US); Garey George Roden, Apalachin, NY (US)

(73) Assignee: BAE Systems Controls, Inc.

( * ) Notice: Subject to any disclaimer, the term of this patent is extended or adjusted under 35 U.S.C. 154(b) by 0 days.

(21) Appl. No.: 10/236,278

(22) Filed: Sep. 6, 2002

(51) Int. Cl.[7] ................................................ H02H 9/08
(52) U.S. Cl. .......................................... 361/42; 361/42
(58) Field of Search ............................ 361/42, 43, 44, 361/45, 93.9; 324/509, 522

(56) References Cited

U.S. PATENT DOCUMENTS

| | | | | |
|---|---|---|---|---|
| 4,012,668 A | * | 3/1977 | Wittlinger | 361/44 |
| 4,200,897 A | * | 4/1980 | Dawley | 361/45 |
| 4,809,123 A | * | 2/1989 | Allington et al. | 361/42 |
| 4,929,901 A | * | 5/1990 | Kimball et al. | 324/529 |
| 5,179,490 A | * | 1/1993 | Lawrence | 361/42 |
| 5,420,740 A | | 5/1995 | MacKenzie et al. | |
| 5,481,194 A | * | 1/1996 | Schantz et al. | 324/522 |
| 5,541,800 A | | 7/1996 | Misencik | |
| 5,561,380 A | | 10/1996 | Sway-Tin et al. | |
| 5,629,601 A | * | 5/1997 | Feldstein | 320/119 |
| 5,736,831 A | * | 4/1998 | Harrington | 320/104 |
| 5,835,322 A | | 11/1998 | Smith et al. | |
| 5,894,393 A | | 4/1999 | Elliott et al. | |
| 5,930,093 A | | 7/1999 | Morrissett | |
| 6,191,555 B1 | * | 2/2001 | Konishi et al. | 320/118 |

OTHER PUBLICATIONS

Lefferson, DC Leakage Current Detector Protects the High Voltage Equipment User, pp. 34, 35 and 37 (Sep. 2000).

* cited by examiner

*Primary Examiner*—Gregory J. Toatley, Jr.
*Assistant Examiner*—Danny Nguyen
(74) *Attorney, Agent, or Firm*—Duane Morris LLP

(57) ABSTRACT

A fault detection system for detecting an unwanted electrical path between a reference potential and at least one of: a) a floating power source, b) a first power conductor coupled to a first terminal of the power source, and c) a second power conductor coupled to a second terminal of the power source. The system comprises an impedance network electrically coupled to the first and second power conductors and having an output terminal for providing a first voltage signal with respect to the reference potential, and an amplifier circuit responsive to the first voltage signal and to a reference voltage for generating an amplified signal indicative of the existence of the unwanted electrical path when the difference between the first voltage signal and the reference voltage exceeds a predetermined value.

19 Claims, 12 Drawing Sheets

(PRIOR ART)

GROUND FAULT DETECTION SYSTEM

RELATED APPLICATIONS

None.

FIELD OF THE INVENTION

The present invention relates to ground fault protection, and more particularly to a DC ground fault sensor system for detecting ground fault conditions.

BACKGROUND OF THE INVENTION

Electrically powered automobiles are vehicles that do not depend on internal combustion engines for propulsive power, but rather on relatively large electric traction batteries. The traction battery of an electric automobile is engaged with an electric traction motor for propelling the automobile, and the traction battery is rechargeable to permit repeated use of the traction battery.

The skilled artisan will appreciate that a traction battery must have a relatively large capacity, and must deliver a relatively large amount of power, compared to a conventional 12 volt automobile storage battery. It is further understood that because power is directly proportional to battery voltage and system current, the high power delivery requirements which must be satisfied by traction batteries necessarily mean that higher electrical voltages will be present in electric automobiles than in automobiles powered by fossil fuels, which typically require only a comparatively low power, low voltage storage battery for energizing auxiliary loads when the internal combustion engine is not operating.

Hybrid electric vehicles (HEVs) combine the internal combustion engine of a conventional vehicle with the battery and electric motor of an electric vehicle. This results in an increase in fuel economy over conventional vehicles. This combination also offers extended range and rapid refueling that users expect from a conventional vehicle, with a significant portion of the energy and environmental benefits of an electric vehicle. The practical benefits of HEVs include improved fuel economy and lower emissions compared to conventional vehicles. The inherent flexibility of HEVs also permits their use in a wide range of applications, from personal transportation to commercial hauling.

Because electric or hybrid electric vehicles require little or no combustion of fossil fuels, such vehicles produce little or no environmentally harmful emissions, in contrast to fossil fuel powered vehicles. Such vehicles are become increasingly attractive alternatives to fossil fuel powered cars. However, because of the high voltage requirements of its traction battery an electric or hybrid electric vehicle raises significant electrical safety concerns.

For example, unwanted electric current flow outside of the intended electric circuit flow (i.e. ground fault conditions) may cause significant damage to electronic components within a system (such as an HEV propulsion system), thereby disabling or even destroying the electronic equipment. In addition, such ground fault conditions may result in an electric shock, which can have graver consequences when the shock is caused by contact with a high voltage traction battery system, as compared to a conventional, relatively low voltage automotive storage battery system. To reduce the likelihood of such shock, many traction battery systems are not grounded to the automobile chassis, in contrast to conventional automotive storage battery systems. Instead, many traction battery systems have a closed loop return path, so that the negative power conductor of the system (i.e., the electrical current return path) is isolated from the chassis of the electric or hybrid electric vehicle.

FIG. 1 shows a detection circuit for detecting a DC ground fault. A high impedance network 700 is coupled between first positive power conductor 200 and second negative power conductor 300 and operates to balance the high voltage battery string equally between the positive and negative voltage values with respect to the ground reference potential (i.e. chassis) voltage 540. The high impedance network 700 comprises resistors Ra, Rb, . . . , Rn connected in series and having a first terminal 710 coupled to first power conductor 200, a second terminal 720 coupled to second power conductor 300 and a third terminal 730 coupled to ground reference potential 540 via Resistor R168. Preferably, each of the resistors Ra, . . . , Rn is of equal resistance and arranged such that the magnitude of the voltage is centered equally above and below chassis. Sensing resistor R168 operates to detect a shift in this centering due to an undesired impedance fault by sensing the induced current through R168.

While such isolated systems may minimize the likelihood of a significant electric shock to a person in the event of a short circuit or low impedance connection between the positive or negative power conductors and chassis, such a circuit provides only for detection of an unwanted electrical path between the chassis (reference potential) and either positive or negative power conductors. It fails to provide any detection of an unwanted electrical path between chassis and the center of the energy storage string and also fails to provide any compensation for re-equalizing the voltage potential between the two power conductors and the chassis. A ground fault detection system for sensing a DC ground fault condition within the high voltage energy storage and actively compensating to correct such condition is desired.

SUMMARY OF THE INVENTION

A fault detection system for detecting an unwanted electrical path between a reference potential and at least one of: a) a floating power source, b) a first power conductor coupled to a first terminal of the power source, and c) a second power conductor coupled to a second terminal of the power source. The system comprises an impedance network electrically coupled to the first and second power conductors and having an output terminal for providing a first voltage signal with respect to the reference potential, and an amplifier circuit responsive to the first voltage signal and to a reference voltage for generating an amplified signal indicative of the existence of the unwanted electrical path when the difference between the first voltage signal and the reference voltage exceeds a predetermined value. In the case of an unwanted electrical path between the chassis reference and a node within the floating power supply, the system is operative to detect a signal indicative of an impedance imbalance from the center point and to provide a compensating impedance for equalizing the voltage between the first and second power conductors with respect to chassis.

A fault detection system for detecting and compensating for an unwanted electrical path between a reference potential and at least one of a floating power source, a first power conductor coupled to a first terminal of the power source, and a second power conductor coupled to a second terminal of the power source, the system comprising an impedance network electrically coupled to the first and second power conductors and having an output terminal for providing a first voltage signal with respect to the reference potential, a high gain amplifier arrangement responsive to the first voltage signal and to a reference voltage for generating an amplified signal indicative of the existence of the unwanted electrical path when the difference between the first voltage signal and the reference voltage exceeds a predetermined value; and a compensating circuit having an input electrically coupled to the output of the high gain amplifier, and first and second outputs electrically coupled via conduction paths to the first and second power conductors, respectively, for providing a compensating signal to at least one of the first and second power conductors, the compensating signal in accordance with the magnitude of the amplified signal for reducing the difference between the first voltage signal relative to the reference voltage.

A fault monitoring apparatus comprises a floating power source having a first terminal coupled to a first power conductor and a second terminal coupled to a second power conductor; an impedance network having a first terminal electrically coupled to the first power conductor, a second terminal electrically coupled to the second power conductor, and a third terminal coupled to reference potential for equally balancing the voltages developed at the first and second power conductors with respect to the reference potential, whereby, upon occurrence of an unintended electrical path between at least one of the first power conductor and the reference potential, the second power conductor and the reference potential, and the power supply and the reference potential, an unintended voltage is developed at the third terminal of the impedance network. An amplifier arrangement is electrically coupled to the third terminal and operative for providing a control signal proportional to the difference between the unintended voltage at the third terminal and the reference potential. A compensating circuit is electrically coupled to the control signal for providing a compensating signal via a feedback path to one of the first and second power conductors, the compensating signal operative for reducing the difference between the unintended voltage developed at the third terminal and the reference voltage.

A fault detection system for detecting an unwanted electrical path between a reference potential and at least one of a power source, a first power conductor coupled to a first terminal of the power source, and a second power conductor coupled to a second terminal of the power source, the system comprising an impedance network electrically coupled to the first and second power conductors, the impedance network operative for centering the voltages associated with the first and second power conductors equally about a reference voltage, the impedance network having a tap for providing a nominally centered voltage signal with respect to the reference voltage, a transistor having a first input terminal electrically coupled to the tap, a second terminal electrically coupled to the first power conductor, and a third terminal electrically coupled to the second power conductor; and an amplifier circuit having a first terminal electrically coupled to the third terminal of the transistor, a second terminal electrically coupled to a reference voltage, and an output terminal, the amplifier circuit having a feedback loop between the first terminal and its output terminal for providing a compensating signal to the third terminal of the transistor to modify the amount of current flowing from the third terminal to the second power conductor.

A fault detection and compensation system comprises a floating power source having a first terminal coupled to a first power conductor and a second terminal coupled to a second power conductor, and an impedance network having a first terminal electrically coupled to the first power conductor, a second terminal electrically coupled to the second power conductor, and a third terminal coupled to chassis for equally balancing the voltages developed at the first and second power conductors with respect to chassis, whereby, upon occurrence of an unintended electrical path between the chassis and a node within the floating power supply, an unintended voltage signal is developed at the third terminal of the impedance network associated with an impedance imbalance between the first and second power conductors with respect to chassis. An amplifier arrangement responsive to the unintended voltage signal provides a control signal indicative of the impedance imbalance between the first and second power conductors with respect to chassis; and a compensating circuit electrically coupled to the amplifier arrangement provides a compensating impedance path to at least one of the first and second power conductors for equalizing the voltage between the first and second power conductors with respect to chassis.

BRIEF DESCRIPTION OF THE DRAWINGS

The advantages, nature, and various additional features of the invention will appear more fully upon consideration of the illustrative embodiments now to be described in detail in connection with accompanying drawings where like reference numerals identify like elements throughout the drawings.

DETAILED DESCRIPTION OF THE INVENTION

Figure 1:
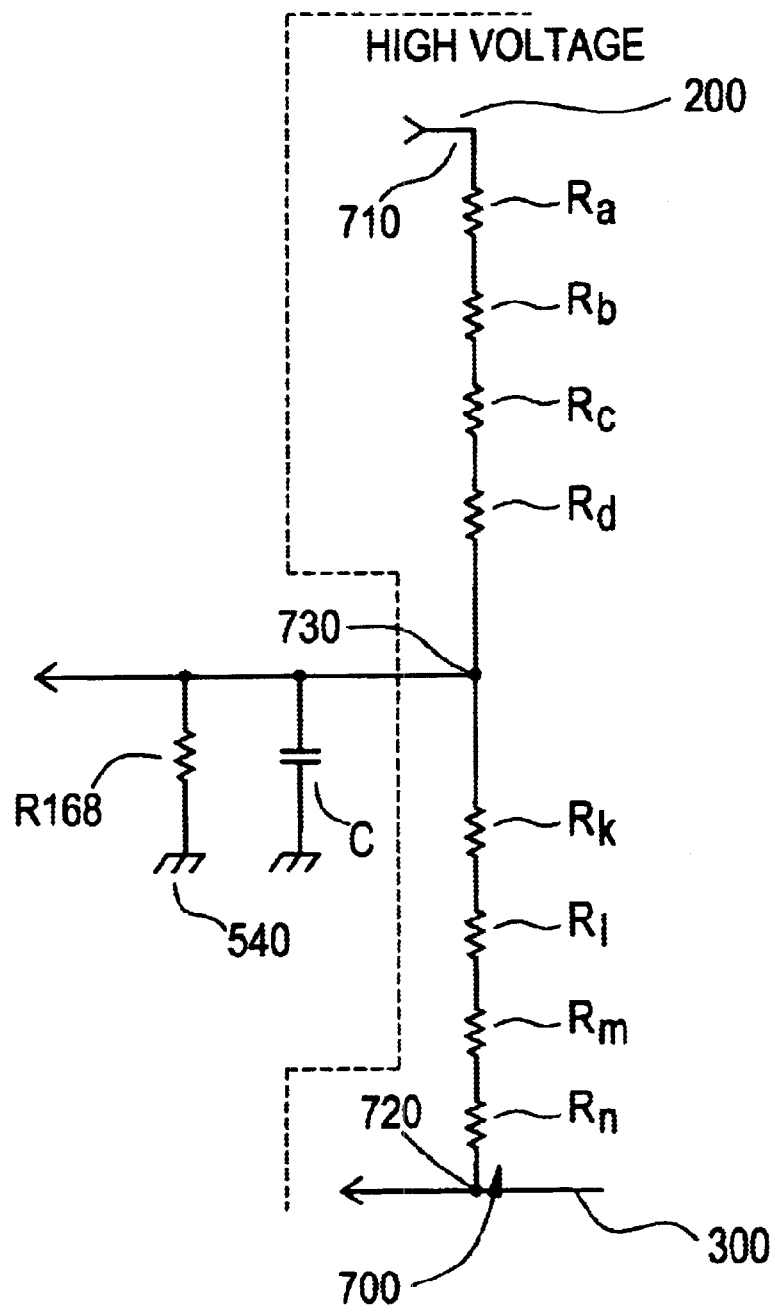
FIG. 1 shows a schematic illustration of a DC ground fault detection system.
Figure 2A:
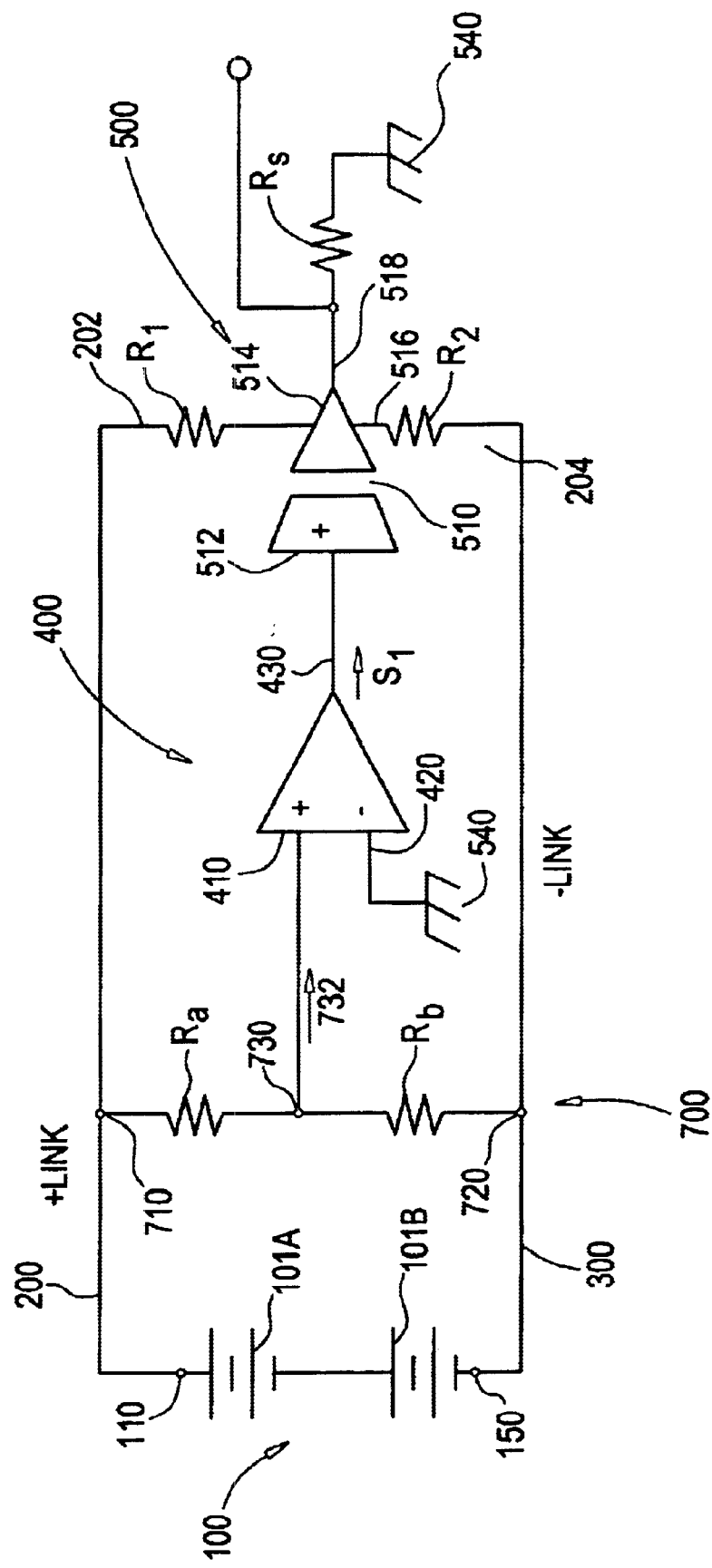
FIG. 2A shows a simplified embodiment of a DC ground fault detector system according to an embodiment of the invention.

FIG. 2A shows a simplified embodiment of a DC ground fault detector system 10 according to an aspect of the invention for detecting an unintended electric path such as a short circuit or very low impedance connection between a load such as high or low power conductors 200, 300 (respectively), or a power source 100, and reference potential 540 such as chassis or ground. In an exemplary embodiment, power source 100 comprises a string of batteries 101A, 101B for providing a high voltage (e.g. 600V) power source for driving a load such as an electric traction motor (not shown). Alternatively, the power source may comprise a series of capacitors (e.g. ultra capacitors), a fuel cell or cells, or even a mechanically stored energy source, for providing a source of power or energy to the system. A first power conductor 200 is electrically coupled to terminal 110 of power source 100 to provide a first source of power (e.g. a positive DC link) to the load or motor. A second power conductor 300 is electrically coupled to terminal 150 of power source 100 to provide a second source of power (e.g. a negative DC link) to the motor.

A high impedance network 700 electrically coupled between the first and second power conductors operates to balance the high voltage battery string of the power supply equally between the positive and negative voltage values with respect to the ground reference potential (i.e. chassis) voltage 540. The high impedance network 700 comprises resistors Ra, Rb, . . . , Rn connected in series and having a first terminal 710 coupled to first power conductor 200, a second terminal 720 coupled to second power conductor 300, and a third terminal or tap 730 for providing a nominally centered voltage signal with respect to the reference voltage for centering the floating power supply between the first and second power conductor voltages. Preferably, each of the resistors Ra, . . . , Rn is of equal resistance and arranged such that the magnitude of the voltage at node 710 with respect to ground 540 is equal to the magnitude of the voltage at node 720 with respect to ground 540, and the centered voltage at terminal 730 is such that the voltage at node 730 equals the reference or ground (i.e. chassis) voltage 540.

An amplifier arrangement 400 comprising a high gain amplifier has its non-inverting input 410 electrically coupled to tap 730 for receiving voltage signal 732, and its inverting input 420 electrically coupled to reference voltage 540. The high gain amplifier arrangement is responsive to the voltage signal 732 and to a reference voltage (i.e. chassis) for generating an amplified signal SI at its output terminal 430. The amplified signal S1 corresponds to the difference between the voltage signal 732 and the reference potential 540. Under normal operating conditions (i.e. no short circuit or low impedance conditions), the output signal at the voltage divider tap 730 is equal to the reference voltage (e.g. 0V), since the high voltage buss is equally balanced between the first power conductor 200 (+DC link) and the second power conductor (–DC link). Upon comparison with the reference voltage (also 0V) the amplified signal SI output from amplifier arrangement 400 is then also 0V. However, upon the occurrence of a short circuit or low impedance connection, the resultant output signal S1 is indicative of the existence of an unwanted electrical path between one of a) the first power conductor, b) the second power conductor, c) the battery pack power sources, and the reference or chassis voltage, when the difference between the voltage signal 732 and the reference voltage 540 exceeds a predetermined value.

Figure 2B:
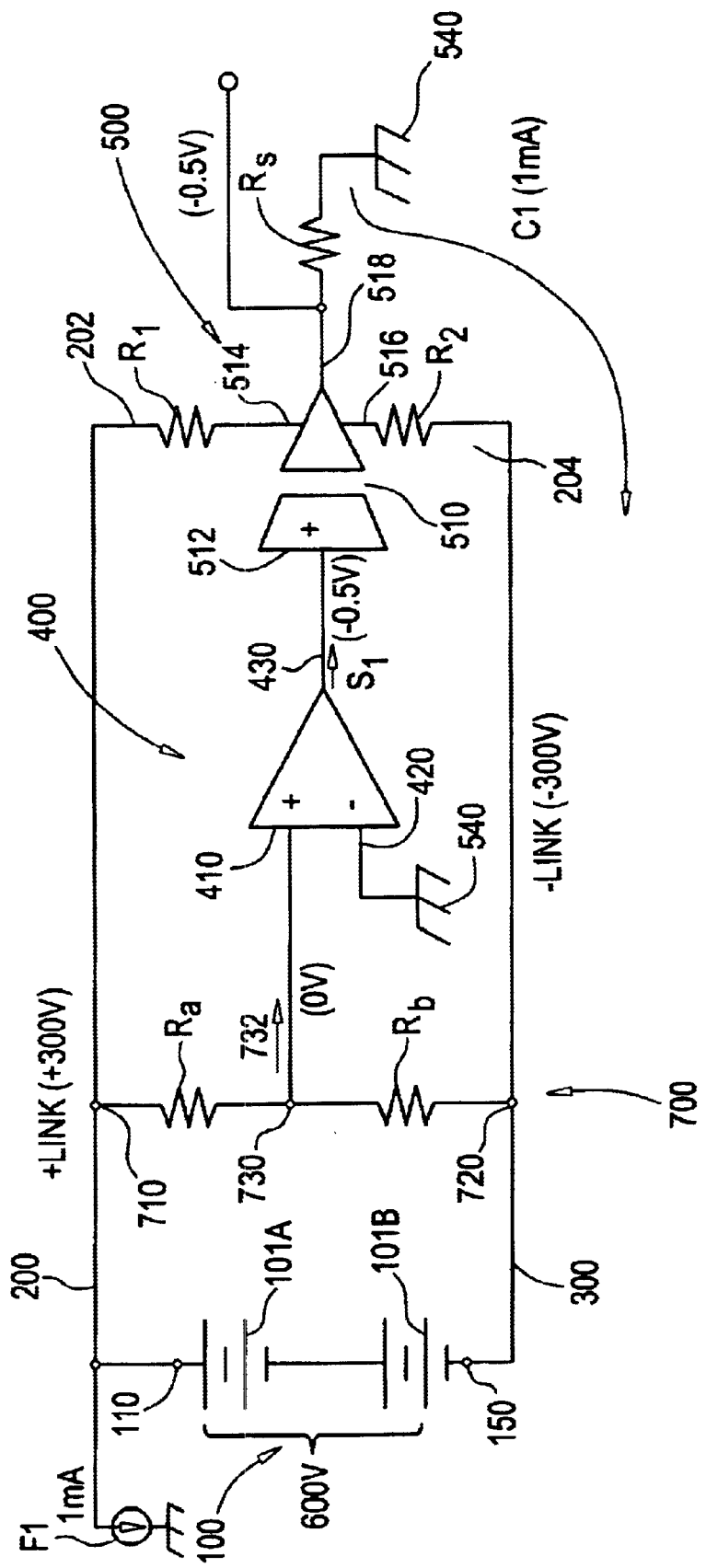
FIG. 2B is a schematic view of the circuit shown in FIG. 2A showing a compensation signal to compensate for a small leakage current according to an aspect of the invention.
Figure 2C:
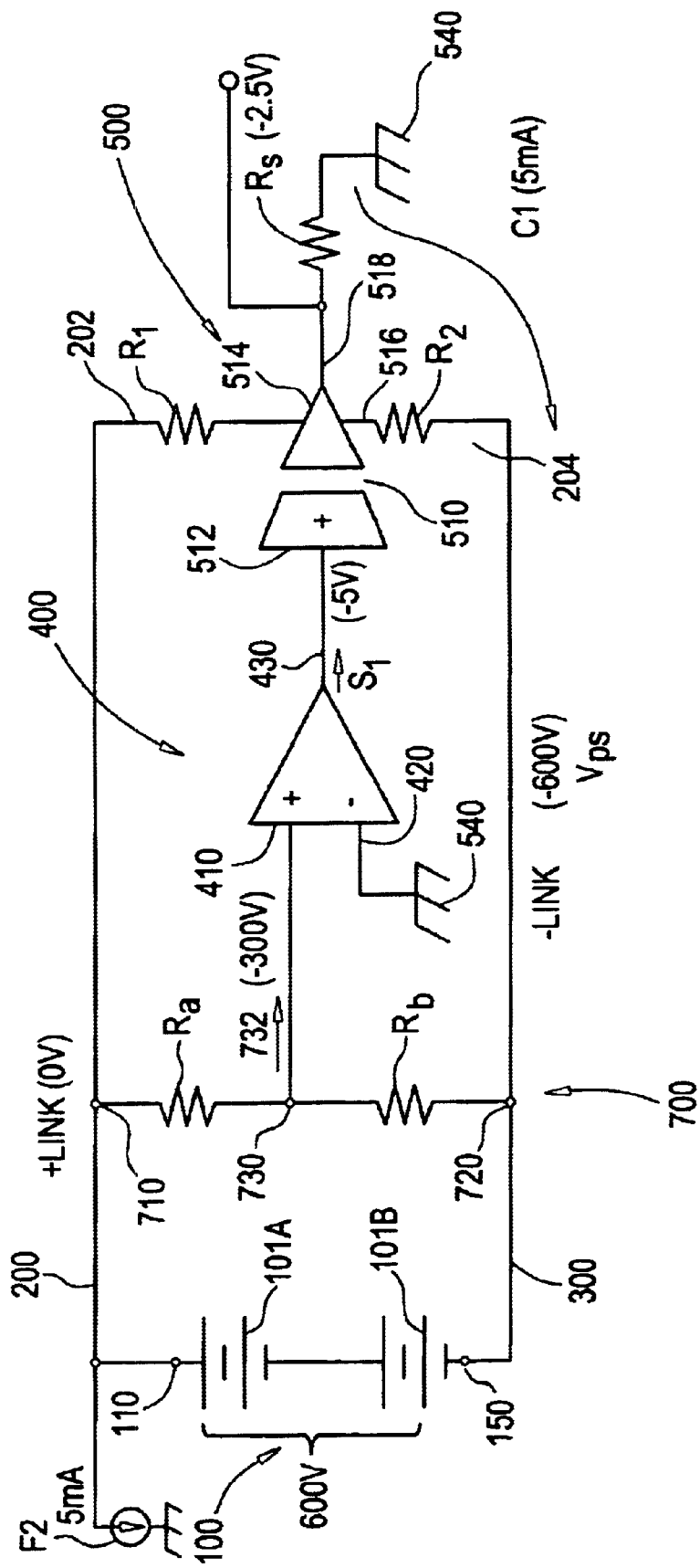
FIG. 2C is a schematic view of the circuit shown in FIG. 2A showing a compensation signal applied to compensate for a large leakage current according to an aspect of the invention.
Figure 2D:
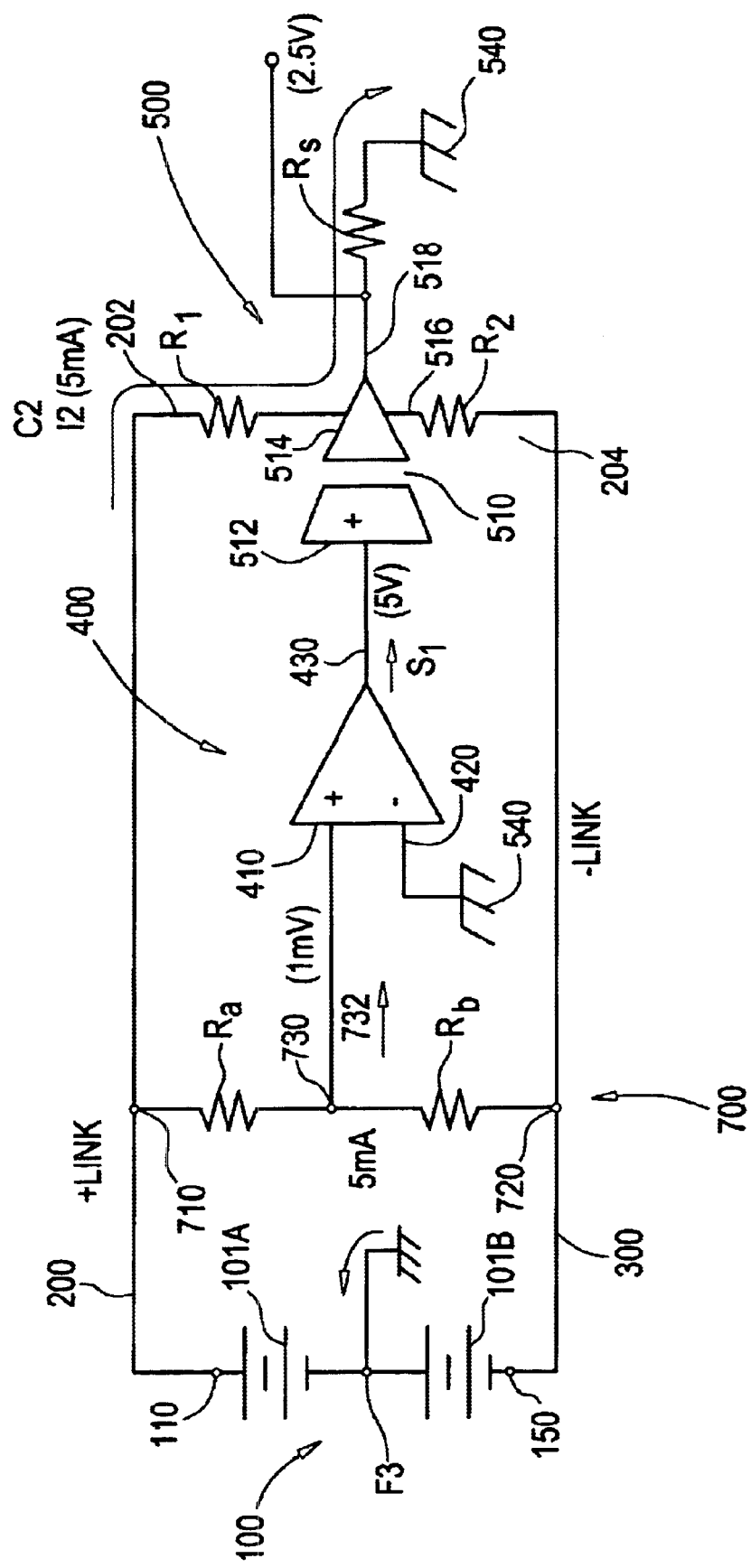
FIG. 2D is a schematic view of the circuit shown in FIG. 2A showing a compensation signal applied to compensate for a large leakage current due to a fault occurring between the batteries of the battery pack power supply according to an aspect of the invention.

A compensating circuit 500 comprising a high power isolation amplifier 510 has an input 512 electrically coupled to the output of the high gain amplifier. First terminal 514 is electrically coupled to the first power conductor 200 via electrical path 202 and second terminal 516 is electrically coupled to the second power conductor 300 via electrical path 204. A sensor 530 comprising sense resistor Rs is electrically coupled between the output terminal 518 and reference voltage 540 for sensing current flowing through the created balancing impedance by the voltage across resistor Rs. As illustrated, the impedances provided by Rs, R1 and the internal impedance between terminals 514 and 518 operate as a balance by providing an impedance of substantially equal magnitude to the unwanted electrical path impedance but between the opposite power conductor and chassis as shown in FIGS. 2B, 2C, 2D. In this manner the energy storage system remains "balanced", where the voltage between the positive conductor and chassis is substantially equal to the voltage between the negative conductor and chassis. The voltage signal Vs can be reported back to a system controller, for example. A compensating signal is provided via a corresponding compensating path (202, 204) to/from at least one of the first and second power conductors from/to the reference potential (chassis). The compensating path is generated from the amplified signal S1 for reducing the difference between the first voltage signal and the reference voltage. In an exemplary embodiment, the compensating signal is in accordance with the magnitude of the amplified signal so as to reduce this difference and hence re-balance the circuit.

FIG. 2B is a schematic view of the circuit shown in FIG. 2A showing a compensation signal C1 applied along path 204 to the second power conductor to compensate for a small leakage current of about 1 milliampere (mA) due to a fault F1 occurring between power conductor 200 and chassis 540. In an exemplary embodiment, assuming a power op amp gain of 2 mA/Volt, an amplified signal S1=0.5V is detected at the output of amplifier arrangement 400. The voltage drop is sensed across 500Ω(ohm) resistor Rs and a 1 mA correction current C1 is delivered to power conductor 300 to compensate for the leakage current due to F1.

FIG. 2C is a schematic view of the circuit shown in FIG. 2A showing a compensation signal C1 applied to the second power conductor to compensate for a large leakage current of about 5 milliampere (mA) due to a hard fault F2 occurring between power conductor 200 and chassis 540. In this case the voltage at power conductor 200 is at reference potential (i.e. 0V). The voltage at power conductor 300 is thus the entire power supply voltage Vps (i.e.–600V). The voltage at tap 730 is therefore Vps/2 or –300V. The output of the operational amplifier 400 is thus saturated at –5V. The voltage drop is sensed across 500 Ω(ohm) resistor Rs and a 5 mA correction current C1 is delivered to power conductor 300 to compensate for the hard fault due to F2.

FIG. 2D is a schematic view of the circuit shown in FIG. 2A showing a compensation signal C2 applied to the first power conductor 200 to compensate for a large leakage current of about 5 milliamperes (mA) due to a hard fault F3 occurring within power supply 100 and, in the exemplary illustration, between the batteries 101A, 101B of power supply battery pack 100. In this case the center voltage at tap 730 is about 1 mV, which is fed into the amplifier circuit 400 and compared with the reference voltage. The output S1 of the operational amplifier 400 saturates at +5V. A current C2 of 5 mA flows through path 202 through sense resistor Rs.

Figure 3A:
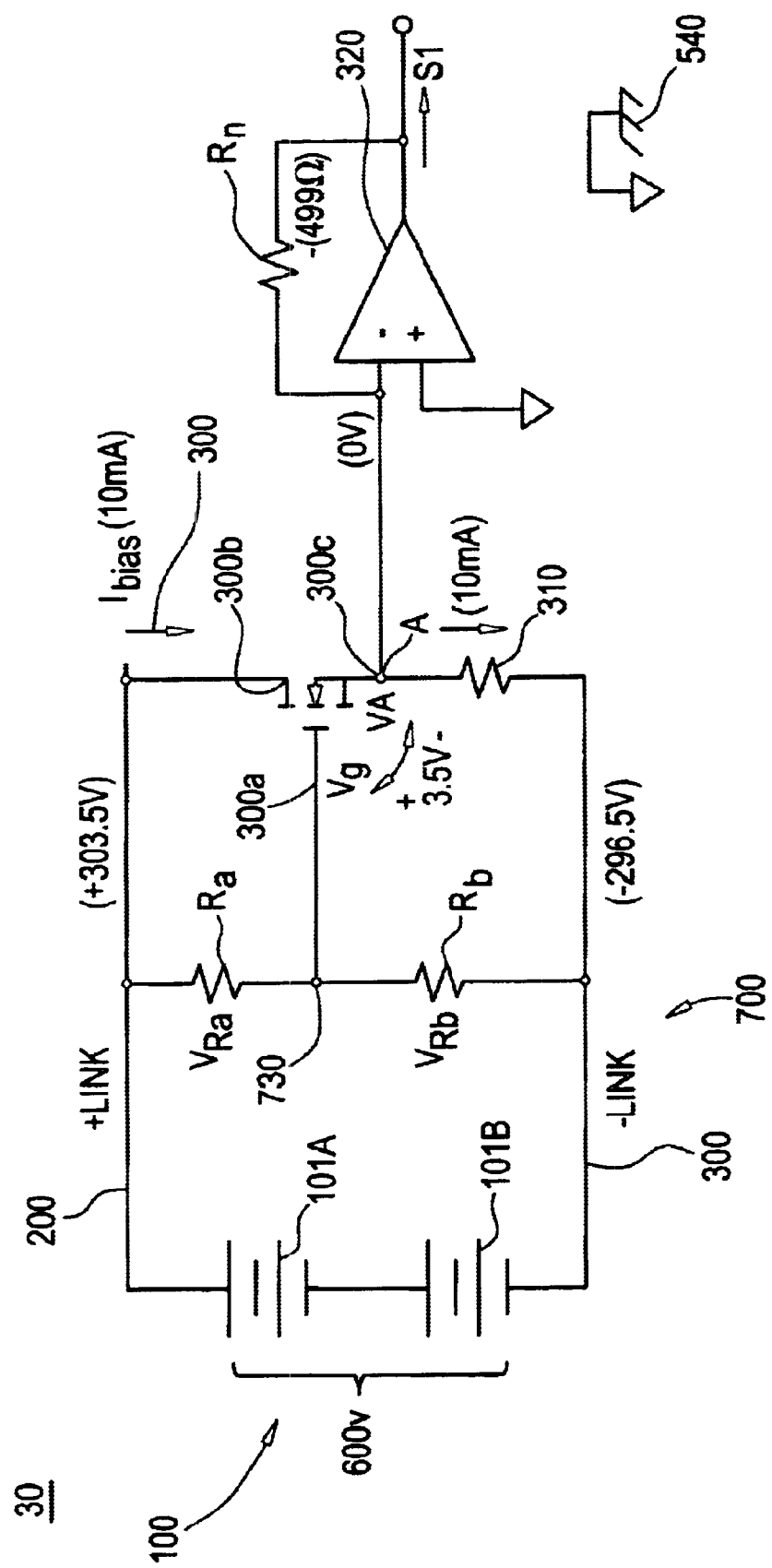
FIG. 3A shows a schematic illustration of a DC ground fault detection system according to another embodiment of the invention.

In an alternative embodimen t shown in FIG. 3A, a DC ground fault detector and monitor system 30 comprises floating battery pack 100 having battery 101A coupled at a first terminal to power conductor 200 and battery 101B coupled at a second terminal to power conductor 300. Impedance network 700 comprises resistors Ra and Rb connected in series and having a first terminal 710 coupled to first power conductor 200, a second terminal 720 coupled to second power conductor 300, and at third terminal or tap 730 for providing a nominally centered voltage signal with respect to the reference voltage for centering the floating power supply between the first and second power conductor voltages. A transistor device 300 such as a Field Effect Transistor (FET) has a first terminal 300a coupled to the output of tap 730, a second terminal 300b coupled to power conductor 200, and a third terminal 300c coupled at node A to load element 310 and to the inverting input of amplifier 320. Transistor device 300 is arranged as a source follower with load element 310 being a bias resistor coupled to second power conductor 300. The non-inverting input of amplifier 320 is coupled to a voltage V. The amplifier output signal S1 is coupled to the inverting terminal through negative feedback resistor Rn. In an exemplary case where no ground fault condition exists, the monitoring system 30 operates as follows. For a power supply battery pack voltage V of 600 volts, the voltage drop $V_{Ra}$ across resistor Ra is 300V, and equals the voltage $V_{Rb}$ across resistor Rb (i.e. $V_{Rb}$=300V). A voltage drop exists between the gate terminal 300a and drain terminal 300b of 3.5V. The voltage at power conductor 200 is thus +303.5V while the voltage at power conductor 300 is −296.5V. The bias current $I_{bias}$ flowing from conductor 200 through bias resistor 310 is about 10 mA. The voltage at the inverting input of amplifier 320 is 0V, with the output S1 also at 0V.

Figure 3B:
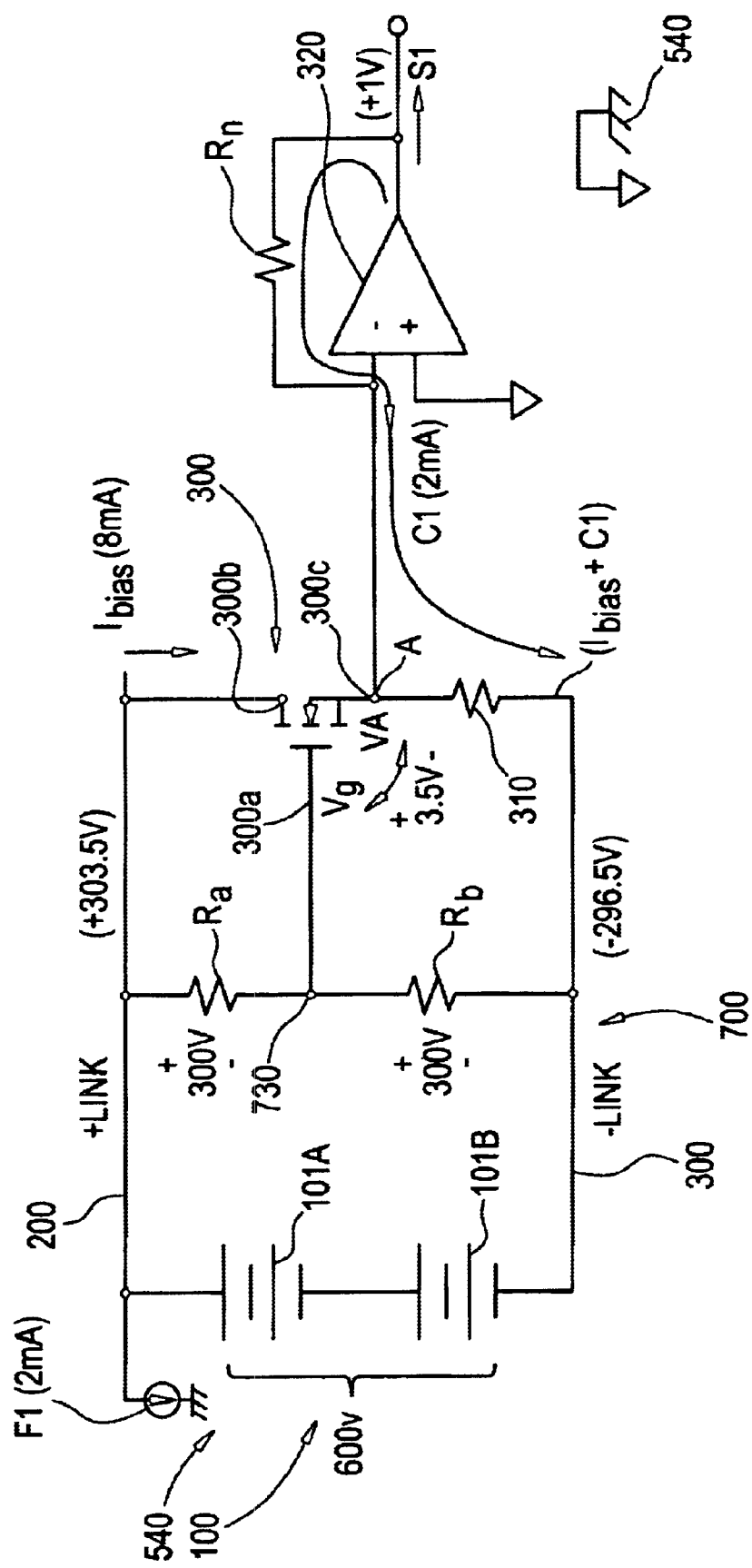
FIG. 3B is a schematic view of the circuit shown in FIG. 3A showing a compensation signal to compensate for a small leakage current according to an aspect of the invention.

FIG. 3B is a schematic view of the circuit shown in FIG. 3A showing a compensation signal C1 of 2 mA applied to the second power conductor 300 through bias resistor 310 to compensate for a small leakage current of about 2 milliampere (mA) due to fault F1 occurring between power conductor 200 and chassis 540. A bias current $I_{bias}$ flowing from conductor 200 of 8 mA combines with compensating current signal C1 fed back to resistor 310 to compensate for the leakage current due to F1.

Figure 3C:
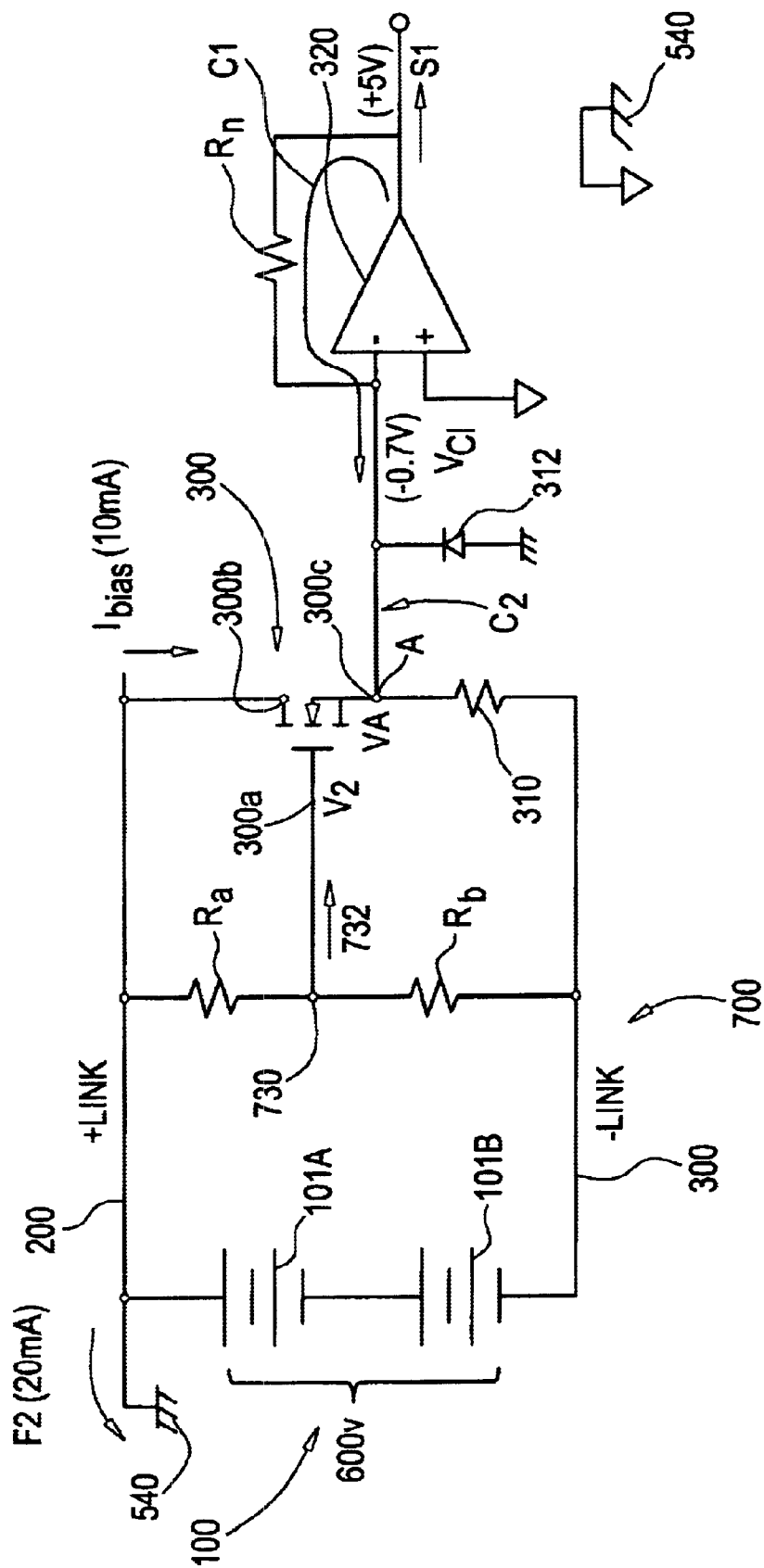
FIG. 3C is a schematic view of the circuit shown in FIG. 3A showing a compensation signal applied to compensate for a large leakage current according to an aspect of the invention.

FIG. 3C is a schematic view of the circuit shown in FIG. 3A showing a compensation signal C1 applied to the second power conductor to compensate for a large leakage current of about 20 milliampere (mA) due to a hard fault F2 occurring between power conductor 200 and chassis 540. FIG. 3C further includes a limiter such as a clamping diode 312 coupled between node A and chassis 540. In this case the voltage at power conductor 200 is at reference potential (i.e. 0V). The bias current $I_{bias}$ flowing from conductor 200 is 0 mA. Diode 312 operates to clamp the voltage at node A at a clamp voltage $V_{CL}$ of −0.7V and the operational amplifier 320 is placed in saturation such that output signal S1 is at +5V. Compensating current C1 of 10 mA flows through the feedback path of the amplifier to bias resistor 310 while compensating current C2 of 10 mA flows through diode 312 to resistor 310. In this manner a current of C1+C2=20 mA flows through resistor 310 and is delivered to power conductor 300 to compensate for the hard fault due to F2.

Figure 4:
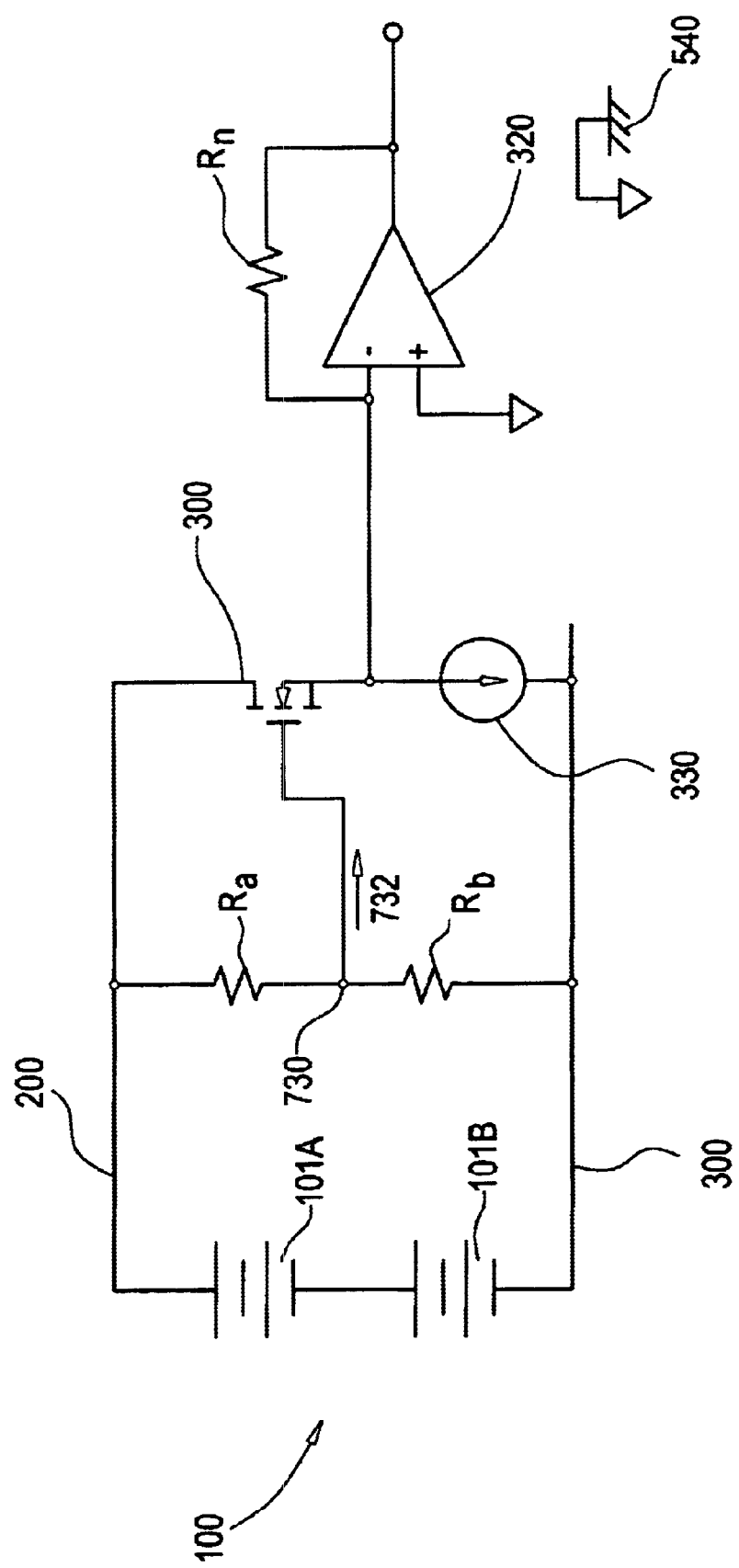
FIG. 4 shows a schematic illustration of a DC ground fault detection system according to another embodiment of the invention.

FIG. 4 shows another alternative embodiment, wherein a current source 330 replaces the bias resistor 310 of FIG. 2A. The current source 330 may operate to limit the fault current to an arbitrary or predetermined level, for example, to 10 mA.

Figure 5:
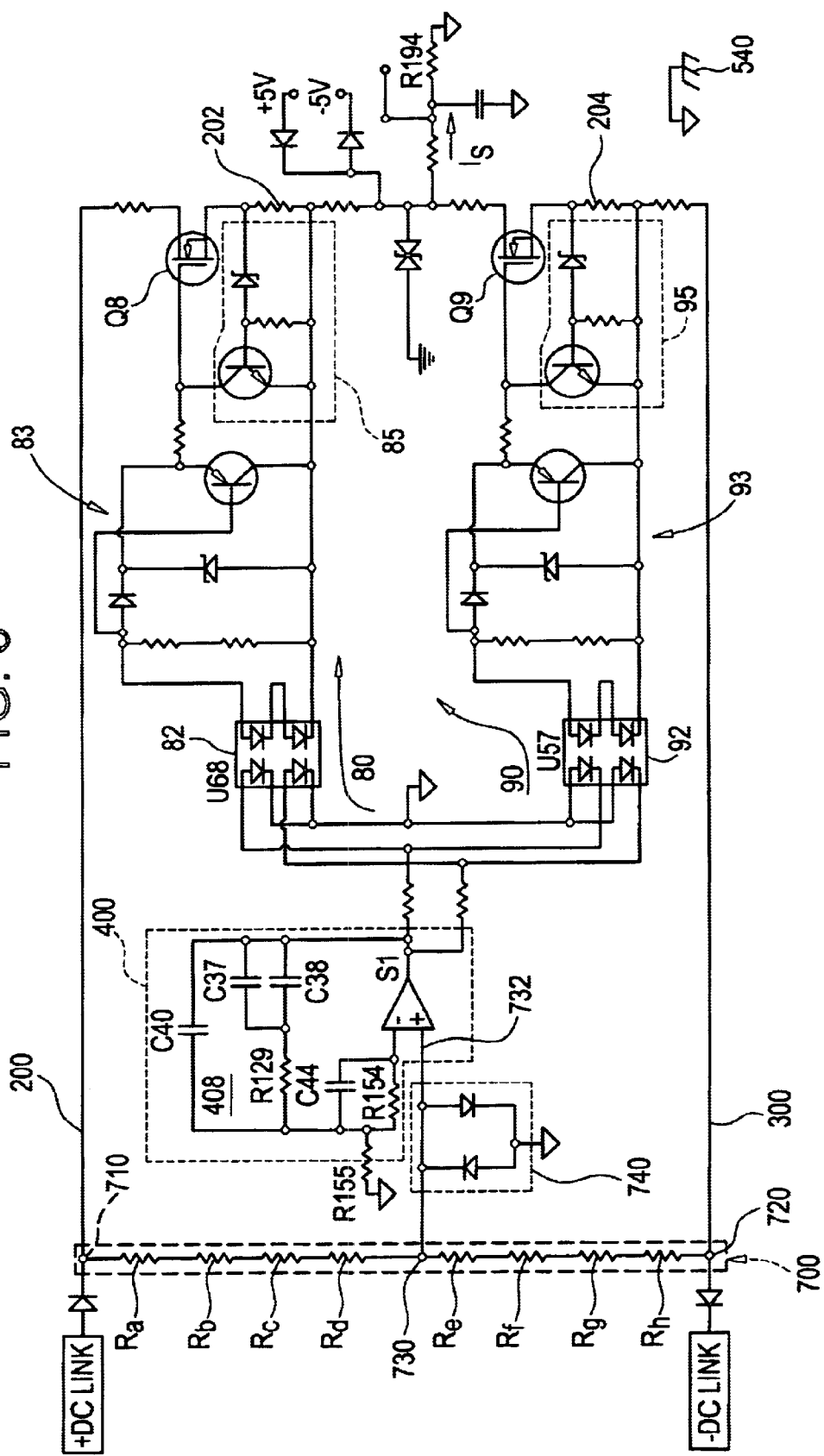
FIG. 5 shows a more detailed schematic illustration of a DC ground fault detection system according to another embodiment of the invention.

Referring now to FIG. 5, there is shown a more detailed embodiment of an active DC ground fault detection and monitoring system 500 according to an aspect of the present invention. A high impedance network 700 electrically coupled between first power conductor 200 and second power conductor 300 operates to balance the high voltage battery string of a power source (not shown) equally between the positive and negative voltage values with respect to the ground reference potential (i.e. chassis) voltage 540. The high impedance network 700 comprises resistors Ra, Rb, . . ., Rh connected in series and having a first terminal 710 coupled to first power conductor 200, a second terminal 720 coupled to second power conductor 300, and a third terminal or tap 730 for providing a nominally centered voltage signal with respect to the reference voltage for centering the floating power supply between the first and second power conductor voltages. Preferably, each of the resistors Ra, . . ., Rh is of equal resistance and arranged such that the magnitude of the voltage at node 710 with respect to ground 540 is equal to the magnitude of the voltage at node 720 with respect to ground 540. Amplifier arrangement 400 comprising a high gain amplifier has its non-inverting input 410 electrically coupled to tap 730 for receiving voltage signal 732, and its inverting input 420 electrically coupled to reference voltage 540 via resistor R155. Input protection circuit 740 illustrated as clamping diodes D21 and D23 operate to protect the input of the amplifier arrangement. The high gain amplifier arrangement is responsive to the voltage signal 732 and to a reference voltage (i.e. chassis) for generating an amplified signal S1 at its output terminal. The amplified signal SI corresponds to the difference between the voltage signal 732 (pack center) and the reference voltage. The output of the amplifier is coupled to the inverting input via error compensation circuitry 408 comprising resistors R129, R154, R155 and capacitors C37, C38, C40 and C44 for compensation for the feedback loop. As shown in FIG. 5, the circuit compares the voltage at the center of the high voltage (HV) buss with respect to chassis using the high gain amplifier. If the HV side is centered with respect to chassis, the voltages will be equal (within component tolerances). That is, under normal operating conditions (i.e. no short circuit or low impedance conditions), the output signal at the voltage divider tap 730 corresponding, for example, to the high voltage (HV) side of the buss is equal to the reference voltage (e.g. 0V), since the high voltage buss is equally balanced between the first power conductor 200 (+DC link) and the second power conductor 300 (−DC link). Upon comparison with the reference voltage (also 0V) the amplified signal S1 output from amplifier arrangement 400 is then also 0V. However, upon the occurrence of a short circuit or low impedance connection, the resultant output signal S1 is indicative of the existence of an unwanted electrical path between one of a) the first power conductor, b) the second power conductor, c) the battery pack power sources, and the reference or chassis voltage, when the difference between the voltage signal 732 and the reference voltage 540 exceeds a predetermined value. In this case, when a sufficient voltage difference exists, the amplifier arrangement 400 operates to activate (i.e. turn on) either FET switch Q8 or FET switch Q9 through respective conduction paths 80, 90. This may be accomplished by turning on one of corresponding couplers 82, 92 shown in the exemplary embodiment as opto-couplers U68, U57. The couplers activate the respective conduction paths through corresponding filter circuits 83, 93 to switches Q8, Q9. Activation of either the "high side" switch (FET Q8) or the "low side" switch (FET Q9) operates to create an equal and opposite impedance with respect to chassis so as to rebalance the HV buss with respect to chassis. By turning on either Q8 or Q9, the current $I_s$ through the created balancing impedance (provided via compensating path 202 for Q8, and path 204 for Q9)is sensed by the voltage developed across sensor resistor R194. The sensed voltage can then be reported back to a system controller or other controlling device. Current limiting circuitry 85, 95 operate to limit the current through respective FETs Q8, Q9 to a predetermined value (e.g. +5 mA or −5mA) for circuit protection. In this manner, for leakages below the predetermined value, the circuit can still operate to center the pack voltage. The above-described circuit may be mounted onto a printed circuit board (PCB) using auto insertion equipment, for example, and used in a variety of applications, including hybrid electric vehicles, electric vehicles or any application where ground fault detection and correction is of concern.

Figure 6:
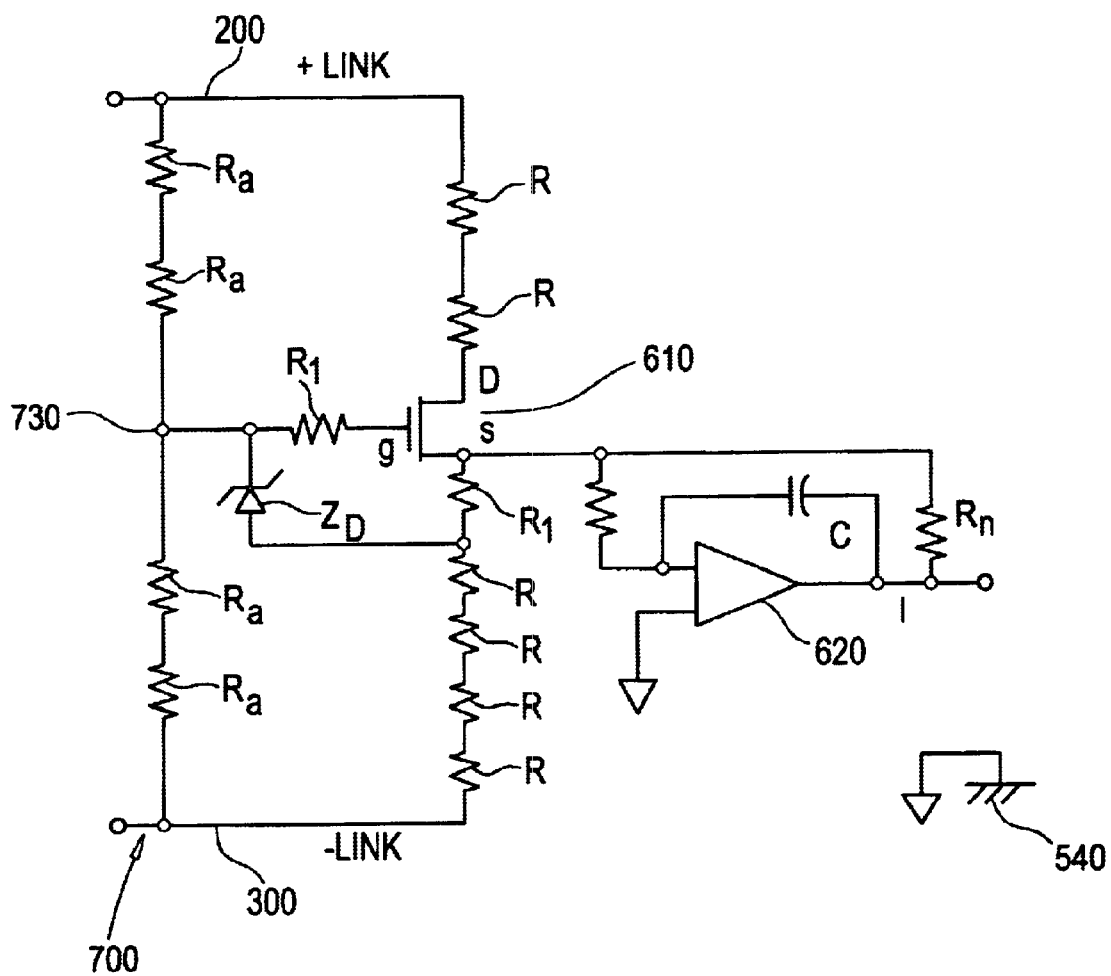
FIG. 6 shows a schematic illustration of a DC ground fault detection system according to another embodiment of the invention.
Figure 7:
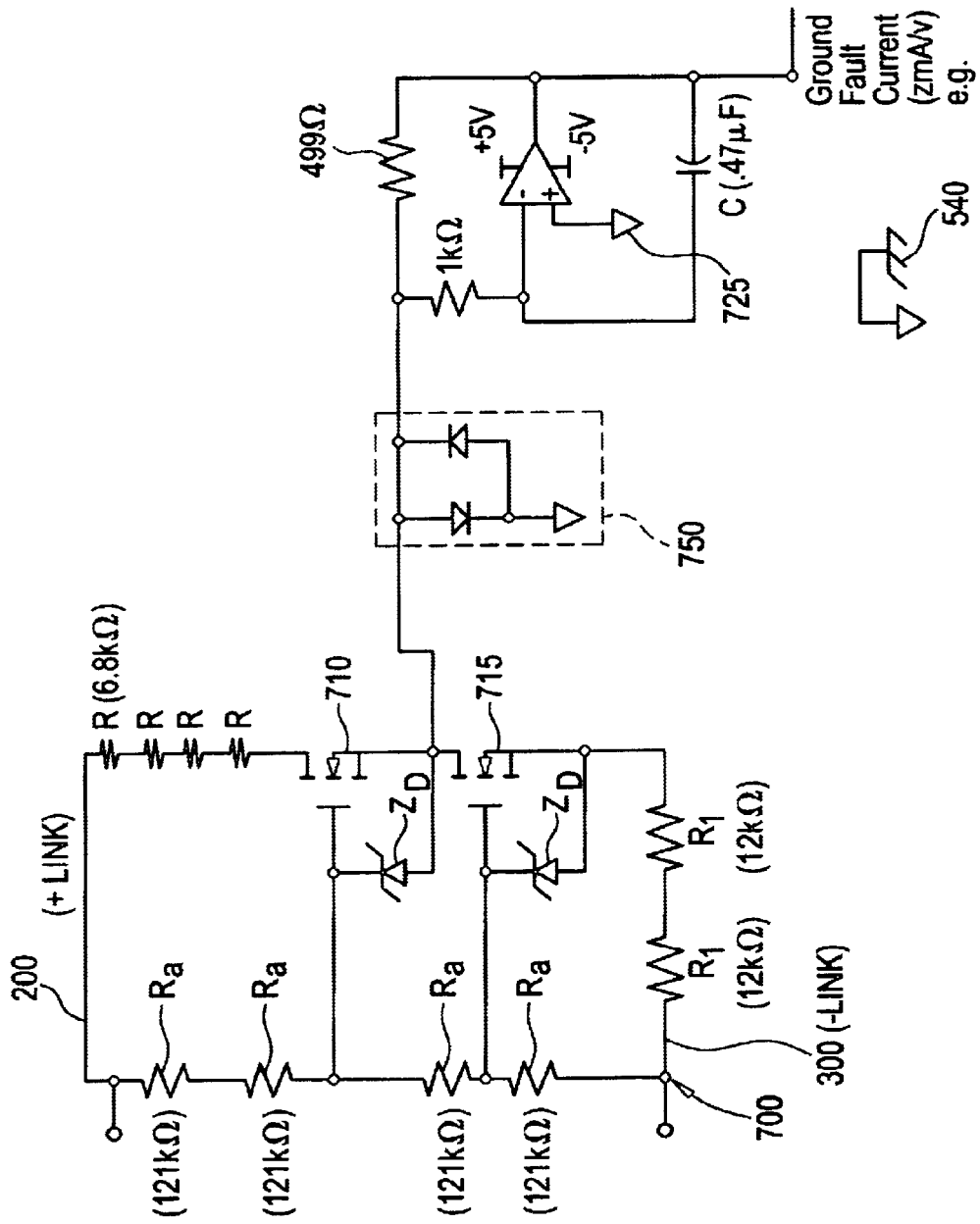
FIG. 7 shows a schematic illustration of a DC ground fault detection system according to another embodiment of the invention.

While the present invention has been described above in terms of specific embodiments, it is to be understood that the invention is not intended to be confined or limited to the embodiments disclosed herein. For example, while the ground fault detection and monitoring circuit and system has been shown in accordance with a feedback loop, FIG. 6 provides an exemplary embodiment of an open loop system according to an aspect of the invention. As shown therein, voltage divider 700 coupled between first and second power conductors 200, 300 has center tap 730 coupled to the gate of FET device 610. FET 610 is configured as a source follower such that its source is coupled to the gate via resistor R1 and Diode $Z_D$. Amplifier arrangement 620 senses the difference in voltages applied at its inverting and non-inverting terminals and provides an output signal indicative of the difference, which is applied via negative feedback path through Rn to its inverting input. In this manner, after a maximum leakage current is detected ($I_{GF}$) a ground fault is declared and the battery pack tends to deviate from its nominal centered voltage. Still further, as shown in FIG. 7 multiple FETs 710, 715 may be coupled to one another in source follower configuration, for example, wherein the gates are clamped by diodes $Z_D$. The output of center tap 730 is coupled via current protection circuit 750 to the inverting input of amplifier arrangement 725 while the non-inverting input is coupled to reference potential. The output signal S1 corresponds to the difference between the nominally centered voltage signal and the reference and is indicative of the existence of an unwanted electrical path or ground fault condition. These and all other such modifications and changes are considered to be within the scope of the appended claims.

What is claimed is:

1. A fault detection system for detecting an unwanted electrical path between a reference potential and at least one of: a) a floating power source, b) a first power conductor coupled to a first terminal of the power source, and c) a second power conductor coupled to a second terminal of the power source, the system comprising:

an impedance network electrically coupled to the first and second power conductors and having an output terminal for providing a first voltage signal with respect to the reference potential, an amplifier circuit responsive to the first voltage signal and to a reference voltage for generating an amplified signal indicative of the existence of the unwanted electrical path when the difference between the first voltage signal and the reference voltage exceeds a predetermined value, a compensating circuit having an input path for coupling to the amplified signal, and output paths for coupling to the first and second power conductors, for providing a compensating signal to at least one of the first and second power conductors for reducing the difference between the first voltage signal and the reference voltage.

2. The system of claim 1, wherein the compensating signal varies in accordance with the magnitude of the amplified signal.

3. The system of claim 1, wherein the compensating circuit comprises a load for sensing a voltage, the sensed voltage corresponding to the degree of compensation applied by the compensating signal.

4. The system of claim 1, wherein said compensating circuit comprises a pair of switches for providing separate conduction paths to said first and second power conductors.

5. The system of claim 4, wherein said pair of switches comprises a pair of transistors.

6. The system of claim 5, wherein each of said transistors is a Field Effect Transistor (FET).

7. The system of claim 4, wherein one of said pair of switches is activated in response to a characteristic of said amplified signal, to conduct along the associated conduction path to the corresponding one of the first and second power conductors, causing an impedance associated with the conduction path with respect to the reference potential sufficient to offset the impedance imbalance between one of the first and second power conductors and the reference potential caused by the unwanted electrical electrical path.

8. The system of claim 1, wherein the power supply comprises a floating power supply.

9. The system of claim 8, wherein the floating power supply comprises one or more batteries interconnected to one another.

10. The system of claim 8, wherein the floating power supply comprises one or more fuel cells interconnected to one another.

11. The system of claim 8, wherein the floating power supply comprises one or more capacitors interconnected to one another.

12. The system of claim 7, wherein the compensating circuit further comprises a pair of current limiters, each associated with a corresponding one of said conduction paths for limiting the amount of current therethrough to a predetermined value.

13. A fault detection system for detecting an unwanted electrical path between a reference potential and at least one of a floating power source, a first power conductor coupled to a first terminal of the power source, and a second power conductor coupled to a second terminal of the power source, the system comprising:

an impedance network electrically coupled to the first and second power conductors and having an output terminal for providing a first voltage signal with respect to the reference potential, means responsive to the first voltage signal and to a reference voltage for generating an amplified signal indicative of the existence of the unwanted electrical path when the difference between the first voltage signal and the reference voltage exceeds a predetermined value, means responsive to said amplified signal for providing a conduction path to one of said first and second power conductors and generating a compensation signal carried via said conduction path for reducing the difference between the first voltage signal and the reference voltage and thereby rebalancing the floating power source with respect to the reference potential.

14. The system of claim 13, wherein said means for generating an amplified signal comprises a high gain amplifier circuit including a feedback arrangement.

15. A fault detection system for detecting and compensating for an unwanted electrical path between a reference potential and at least one of a floating power source, a first power conductor coupled to a first terminal of the power source, and a second power conductor coupled to a second terminal of the power source, the system comprising:

an impedance network electrically coupled to the first and second power conductors and having an output terminal for providing a first voltage signal with respect to the reference potential, a high gain amplifier arrangement responsive to the first voltage signal and to a reference voltage for generating an amplified-signal indicative of the existence of the unwanted electrical path when the difference between the first voltage signal and the reference voltage exceeds a predetermined value; and a compensating circuit having an input electrically coupled to the output of the high gain amplifier, and first and second outputs electrically coupled via conduction paths to the first and second power conductors, respectively, for providing a compensating signal to at least one of the first and second power conductors, the compensating signal being substantially equal and opposite that of the signal carried via the unwanted electrical path for reducing the difference between the first voltage signal relative to the reference voltage below the predetermined value and thereby rebalancing the floating power source with respect to the reference potential.

16. The system of claim 15, wherein the compensating circuit comprises a load for sensing a voltage corresponding to the degree of compensation applied by the compensating signal.

17. A fault monitoring apparatus comprising:

a floating power source having a first terminal coupled to a first power conductor and a second terminal coupled to a second power conductor;

an impedance network having a first terminal electrically coupled to the first power conductor, a second terminal electrically coupled to the second power conductor, and a third terminal coupled to reference potential for equally balancing the voltages developed at the first and second power conductors with respect to the reference potential, whereby, upon occurrence of an unintended electrical path between at least one of the first power conductor and the reference potential, the second power conductor and the reference potential, and the power supply and the reference potential, an unintended voltage is developed at the third terminal of the impedance network;

an amplifier arrangement electrically coupled to the third terminal and operative for providing a control signal proportional to the difference between the unintended voltage at the third terminal and the reference potential; and a compensating circuit responsive to the control signal for providing a compensating signal via a feedback path to one of the first and second power conductors when the value of the control signal indicates a fault signal condition associated with the unintended electrical path, the compensating signal operative for reducing the difference between the unintended voltage developed at the third terminal and the reference voltage to a value below a threshold value and thereby rebalance the floating power source with respect to the reference potential.

18. A fault detection system for detecting an unwanted electrical path between a reference potential and at least one of a power source, a first power conductor coupled to a first terminal of the power source, and a second power conductor coupled to a second terminal of the power source, the system comprising:

an impedance network electrically coupled to the first and second power conductors, the impedance network operative for centering the voltages associated with the first and second power conductors equally about a reference voltage, the impedance network having a tap for providing a nominally centered voltage signal with respect to the reference voltage, a transistor having a first input terminal electrically coupled to the tap, a second terminal electrically coupled to the first power conductor, and a third terminal electrically coupled to the second power conductor; and an amplifier circuit having a first terminal electrically coupled to the third terminal of the transistor, a second terminal electrically coupled to a reference voltage, and an output terminal, said amplifier circuit having a feedback loop between first terminal and its output terminal for providing a compensating signal to the third terminal of the transistor to modify the amount of current flowing from the third terminal to the second power conductor.

19. A fault detection and compensation system comprising:

a floating power source having a first terminal coupled to a first power conductor and a second terminal coupled to a second power conductor;

an impedance network having a first terminal electrically coupled to the first power conductor, a second terminal electrically coupled to the second power conductor, and a third terminal coupled to chassis for equally balancing the voltages developed at the first and second power conductors with respect to chassis, whereby, upon occurrence of an unintended electrical path between the chassis and a node within the floating power supply, an unintended voltage signal is developed at the third terminal of the impedance network associated with an impedance imbalance between the first and second power conductors with respect to chassis;

an amplifier arrangement responsive to the unintended voltage signal for providing a control signal indicative of the impedance imbalance between the first and second power conductors with respect to chassis; and a compensating circuit electrically coupled to the amplifier arrangement for providing a compensating impedance path to at least one of the first and second power conductors for equalizing the voltage between the first and second power conductors with respect to chassis.

* * * * *